(12) United States Patent
Kim et al.

(10) Patent No.: US 7,993,958 B2
(45) Date of Patent: Aug. 9, 2011

(54) ORGANIC THIN FILM TRANSISTOR ARRAY PANEL AND MANUFACTURING METHOD THEREOF

(75) Inventors: Bo-Sung Kim, Seoul (KR); Woo-Jae Lee, Yongin-si (KR); Min-Seong Ryu, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1417 days.

(21) Appl. No.: 11/151,485

(22) Filed: Jun. 13, 2005

(65) Prior Publication Data

US 2005/0274953 A1   Dec. 15, 2005

(30) Foreign Application Priority Data

Jun. 14, 2004   (KR) .................. 10-2004-0043461

(51) Int. Cl.
*H01L 51/40* (2006.01)
(52) U.S. Cl. .................................... 438/99; 438/149
(58) Field of Classification Search ............ 438/149, 438/99
See application file for complete search history.

(56) References Cited

U.S. PATENT DOCUMENTS

| | | | |
|---|---|---|---|
| 5,946,551 A | 8/1999 | Dimitrakopoulos et al. | |
| 6,344,662 B1 | 2/2002 | Dimitrakopoulos et al. | |
| 6,500,604 B1 | 12/2002 | Dimitrakopoulos et al. | |
| 6,580,155 B1* | 6/2003 | Muroyama | 257/639 |
| 6,740,900 B2* | 5/2004 | Hirai | 257/40 |
| 6,828,582 B1* | 12/2004 | Ando et al. | 257/40 |
| 2002/0045289 A1 | 4/2002 | Dimitrakopoulos et al. | |
| 2003/0007106 A1 | 1/2003 | Sakamoto et al. | |
| 2003/0007114 A1 | 1/2003 | Kim et al. | |
| 2003/0080338 A1 | 5/2003 | Yamazaki et al. | |
| 2003/0102471 A1 | 6/2003 | Kelley et al. | |
| 2003/0117068 A1 | 6/2003 | Forrest et al. | |
| 2003/0134487 A1* | 7/2003 | Breen et al. | 438/455 |
| 2003/0193624 A1* | 10/2003 | Kobayashi et al. | 349/42 |
| 2005/0158454 A1* | 7/2005 | Lee et al. | 427/66 |

FOREIGN PATENT DOCUMENTS

| | | |
|---|---|---|
| CN | 1395140 | 2/2003 |
| EP | 1416548 | 5/2004 |
| JP | 2000056337 | 2/2000 |
| JP | 2000066233 | 3/2000 |
| JP | 2002314093 | 10/2002 |
| JP | 2003098548 | 4/2003 |
| JP | 2003258164 | 9/2003 |
| JP | 2003324202 | 11/2003 |
| JP | 2003338629 | 11/2003 |
| KR | 100303934 | 7/2001 |
| KR | 1020020034873 | 5/2002 |
| KR | 100399283 | 9/2003 |
| WO | 04001855 A1 | 12/2003 |

* cited by examiner

*Primary Examiner* — Samuel A Gebremariam
(74) *Attorney, Agent, or Firm* — Cantor Colburn LLP (57) ABSTRACT

A method of manufacturing a thin film transistor array panel is provided, the method including: forming a gate line on a substrate; forming a gate insulating layer on the gate line; forming a data line and a drain electrode on the gate insulating layer; forming an organic semiconductor layer on the data line, the drain electrode and an exposed portion of the gate insulating layer between the data line and the drain electrode; forming a protective member fully covering the organic semiconductor layer; forming a passivation layer on the protective layer, the data line, and the drain electrode; forming a contact hole in the passivation layer to expose a portion of the drain electrode; and forming a pixel electrode on the passivation layer, the pixel electrode connected to the drain electrode through the contact hole.

5 Claims, 6 Drawing Sheets

ORGANIC THIN FILM TRANSISTOR ARRAY PANEL AND MANUFACTURING METHOD THEREOF

The present application claims priority from Korean Patent Application No. 2004-43461 filed on Jun. 14, 2004, the contents of which are incorporated by reference herein in their entireties.

BACKGROUND OF THE INVENTION

1. Field of the Invention

The present invention relates to a thin film transistor array panel and a manufacturing method thereof, and in particular, to an organic thin film transistor array panel and a manufacturing method thereof.

2. Description of Related Art

Electric field effect transistors including organic semiconductors have been vigorously researched as driving devices for next generation display devices. Organic semiconductors may be classified into low molecule compounds such as oligothiophene, pentacene, phthalocyanine, and C60; and high molecule compounds such as polythiophene and polythienylenevinylene. The low molecule semiconductors have a high mobility in a range of about 0.05-1.5 msV, as well as superior on/off current ratios.

However, conventional processes of manufacturing organic thin film transistors (TFTs), including low molecule semiconductor compounds, can be complicated in that it requires formation of a low molecule semiconductor pattern using a shadow mask and vacuum deposition in order to avoid solvent-induced, in-plane expansion caused by organic solvents.

In addition, the conventional organic semiconductor devices have drawbacks such that their structures and/or properties are subject to damage and/or changes during or after the manufacturing processes. As a result, the conventional organic TFTs are inevitably subject to deterioration in their characteristics.

In order to protect the organic semiconductor, an organic semiconductor layer may be patterned using a photoresist. However, this protection of the organic semiconductor is still insufficient. What is needed, therefore, is an improved organic thin film transistor array panel and a simplified manufacturing process thereof.

SUMMARY OF THE INVENTION

The above disadvantages and shortcomings are overcome or alleviated by an organic thin film transistor array panel and manufacturing method thereof. The method includes forming a gate line on a substrate, forming a gate insulating layer on the gate line, and forming a data line and a drain electrode on the gate insulating layer. The method also includes forming an organic semiconductor layer on the data line, the drain electrode, and an exposed portion of the gate insulating layer between the data line and the drain electrode. The method further includes forming a protective member fully covering the organic semiconductor layer, and forming a passivation layer on the protective member, the data line, and the drain electrode. The method further includes forming a contact hole in the passivation layer to expose a portion of the drain electrode, and forming a pixel electrode on the passivation layer. The pixel electrode is connected to the drain electrode through the contact hole.

A thin film transistor array panel is provided, which includes a gate line formed on a substrate, a gate insulating layer formed on the gate line, and a data line and a drain electrode formed on the gate insulating layer. The thin film transistor array panel also includes an organic semiconductor layer formed on the data line, the drain electrode, and an exposed portion of the gate insulating layer between the data line and the drain electrode. The thin film transistor array panel further includes a protective member formed on the organic semiconductor layer and fully covers the organic semiconductor layer. The thin film transistor array panel also includes a passivation layer formed on the protective member, the data line, and the drain electrode. A contact hole is formed in the passivation layer to expose a portion of the drain electrode. The thin film transistor array panel further includes a pixel electrode formed on the passivation layer. The pixel electrode is connected to the drain electrode through the contact hole.

Other embodiments will be or become apparent to one of skill in the art upon review of the following drawings and detailed description. It is intended that all such additional embodiments be included within this description, be within the scope of the present invention, and be protected by the accompanying claims.

BRIEF DESCRIPTION OF THE DRAWINGS

The present invention will become more apparent by describing embodiments thereof in detail with reference to the accompanying drawings in which.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein. Like numerals refer to like elements throughout. In accordance with exemplary embodiments, an organic thin film transistor array panel and manufacturing method thereof is presented.

In the drawings, the thickness of layers and regions of the elements have been exaggerated for purposes of clarity. In addition, it will be understood that when an element (e.g., a layer, region or substrate) is described as being "on" another element, it will be construed as either being directly on the other element or that intervening elements may be present between the elements. By contrast, when an element is referred to as being "directly on" another element, it will be construed such that no intervening elements are present between the elements.

Figure 1:
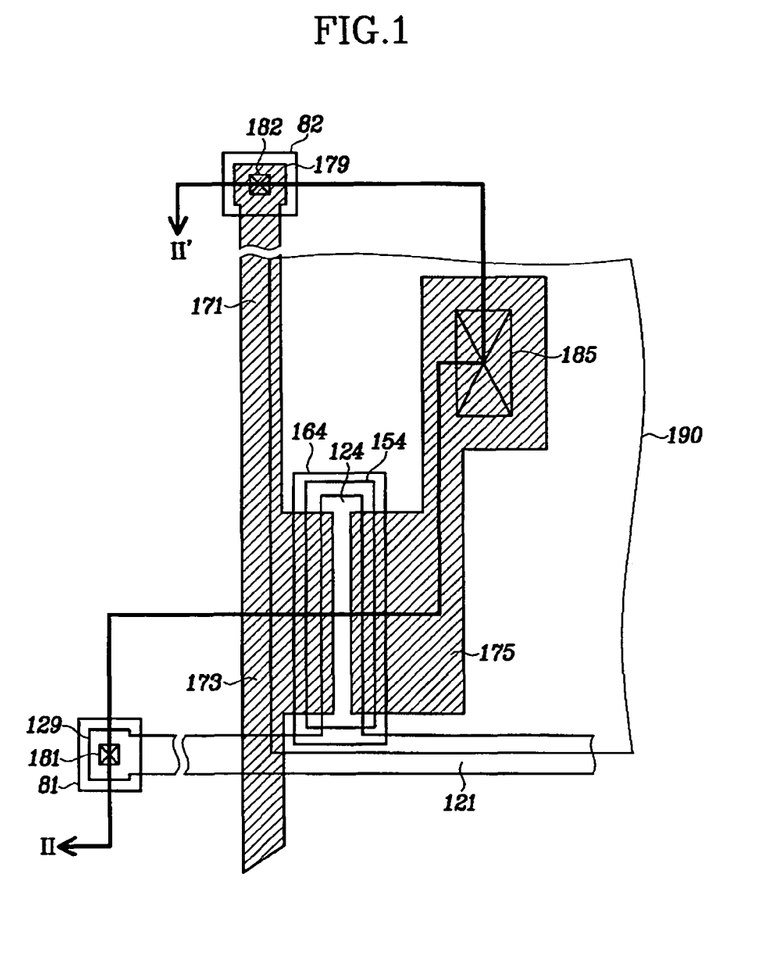
FIG. 1 is a layout view of an exemplary TFT array panel for an LCD according to an embodiment of the present invention.
Figure 2:
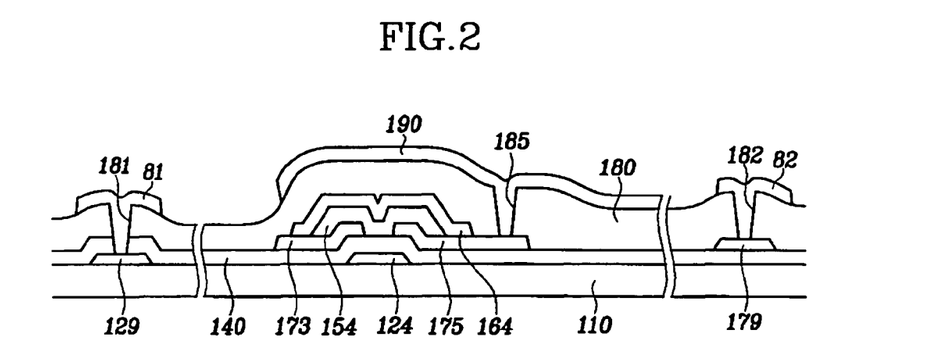
FIG. 2 is a sectional view of the TFT array panel shown in FIG. 1 taken along the line II-II'.

Turning now to FIGS. 1 and 2, a TFT array panel relating to an LCD in accordance with an exemplary embodiment of the present invention will now be described. It will be understood that the TFT array panel of the present invention may be employed with other types of displays devices such as OLED. In particular, FIG. 1 is a layout view of an exemplary TFT array panel, and FIG. 2 is a sectional view of the TFT array panel shown in FIG. 1 taken along line II-II'.

A plurality of gate lines 121 are formed on an insulating substrate 110 such as transparent glass, silicone, or plastic.

The gate lines 121 extend substantially in a transverse direction of the TFT array panel to transmit gate signals. Each of gate lines 121 includes a plurality of gate electrodes 124 protruding upward and an end portion 129 having a large area for contact with another layer or a driving circuit. The gate lines 121 may extend to be connected to a driving circuit (not shown) that may be integrated on the substrate 110.

The gate lines 121 are, for example, made of Al containing metal such as Al and Al alloy, Ag containing metal such as Ag and Ag alloy, Cu containing metal such as Cu and Cu alloy, Au containing material such as Au and Au alloy, Mo containing metal such as Mo and Mo alloy, Cr, Ti or Ta. The gate lines 121 may have a multi-layered structure including two films having different physical characteristics. One of the two films is, for example, made of low resistivity metal including Al containing metal, Ag containing metal, and Cu containing metal for reducing signal delay or voltage drop in the gate lines 121. The other film is, for example, made of material such as Mo containing metal, Cr, Ta or Ti, which is known to have good physical, chemical, and electrical contact characteristics with other materials such as indium tin oxide (ITO) or indium zinc oxide (IZO). Examples of the combination of the two films are a lower Cr film and an upper Al (alloy) film and a lower Al (alloy) film and an upper Mo (alloy) film. However, these films may be made of various metals or conductors.

The lateral sides of the gate lines 121 are inclined relative to a surface of the substrate, and the inclination angle thereof ranges about 30-80 degrees.

A gate insulating layer 140 is formed on the gate lines 121. The gate insulating layer 140 is, for example, made of silicon dioxide ($SiO_2$) and has a surface treated with octadecyl-trichloro-silane (OTS). However, the gate insulating layer 140 may be made of silicon nitride (SiNx), or organic material such as maleimide-styrene, polyvinylphenol (PVP), and modified cyanoethylpullulan (m-CEP).

A plurality of data lines 171 and a plurality of drain electrodes 175 are formed on the gate insulating layer 140.

The data lines 171 extend substantially in a longitudinal direction of the TFT array panel to transmit data voltages and intersect the gate lines 121. Each of data lines 171 includes an end portion 179 having a large area for contact with another layer or an external device and a plurality of source electrodes 173 projecting toward the gate electrodes 124. Each of the source electrodes 173 is disposed opposite to corresponding one of the drain electrodes 175 with respect to a gate electrode 124. Each source electrode 173 and a corresponding drain electrode 175 are apart from each other.

Like the gate lines 121, the data lines 171 and the drain electrodes 175 have inclined edge profiles, and the inclination angles thereof range about 30-80 degrees.

A plurality of organic semiconductor islands 154 are each formed on the source electrode 173, the drain electrode 175, and the gate insulating layer 140. In this embodiment, each organic semiconductor island is disposed over corresponding one of the gate electrodes 124 such that the organic semiconductor island 154 fully covers the gate electrode 124. Edges of the gate electrode 124 and the organic semiconductor island 154 are overlapped in this embodiment.

The organic semiconductor islands 154 may include a high molecular compound or a low molecular compound that is soluble in an aqueous solution or organic solvent. Usually, a high molecular organic semiconductor material is very soluble in solvent and, thus, suitable for printing. Some types of low molecular organic semiconductors are very soluble in organic solvent, making them suitable for the organic semiconductor islands 154.

In accordance with one embodiment, the organic semiconductor islands 154 may be made of, or from derivatives of, tetracene or pentacene with substituent. Alternatively, the organic semiconductor islands 154 may be made of oligothiophene including four to eight thiophenes connected at the positions 2, 5 of thiophene rings.

In another embodiment, the organic semiconductor islands 154 may be made of perylenetetracarboxylic dianhydride (PTCDA), naphthalenetetracarboxylic dianhydride (NTCDA), or their imide derivatives.

In another embodiment, the organic semiconductor islands 154 may be made of metallized phthalocyanine or halogenated derivatives thereof. The metallized phthalocyanine may include Cu, Co, Zn, etc.

In a further embodiment, the organic semiconductor islands 154 may be made of co-oligomer or co-polymer of thienylene and vinylene. In addition, the organic semiconductor islands 154 may be made of regioregular polythiophene.

In yet another embodiment, the organic semiconductor islands 154 may be made of perylene, coroene or derivatives thereof with substituent.

In yet a further embodiment, the organic semiconductor islands 154 may be made of derivatives of aromatic or heteroaromatic ring of the above-described derivatives with at least one hydrocarbon chain having one to thirty carbon atoms.

A gate electrode 124, a source electrode 173, and a drain electrode 175, along with a semiconductor island 154, form a TFT having a channel formed in the semiconductor island 154. In particular, the channel is disposed between the source electrode 173 and the drain electrode 175.

A plurality of protective members 164 are each formed on the semiconductor island 154. The protective members 164 are, for example, made of insulating material that can be dry processed and deposited under low temperature. An example of such a material is a polyxylene polymer (commercially known as "parylene") that can be formed at or below room temperature. The protective members 164 protect the organic semiconductor islands 154 from being damaged in the manufacturing process. The protective members 164 fully cover the organic semiconductor islands 154.

A passivation layer 180 is formed on the data lines 171, the drain electrodes 175, and the protective members 164. The passivation layer 180 is, for example, made of inorganic insulator such as silicon nitride or silicon oxide, organic insulator, or low dielectric insulating material. The low dielectric material has, for example, dielectric constant lower than 4.0 and examples thereof include a-Si:C:O and a-Si:O:F formed by plasma enhanced chemical vapor deposition (PECVD). The organic insulator may have photosensitivity and the passivation layer 180 may have a flat surface. The passivation layer 180 may have a double-layered structure including a lower inorganic film and an upper organic film so that it may take the advantage of the organic film as well as protect the exposed portions of the organic semiconductor islands 154.

The passivation layer 180 has a plurality of contact holes 182 and 185 exposing end portions 179 of the data lines 171 and the drain electrodes 175, respectively. The passivation layer 180 and the gate insulating layer 140 have a plurality of contact holes 181 exposing end portions 129 of the gate lines 121.

A plurality of pixel electrodes 190 are formed on the passivation layer 180, and a plurality of contact assistants 81 and 82 are formed in the contact holes 181 and 182. The pixel electrodes 190 and the contact assistants 81 and 82 are, for example, made of a transparent conductor such as ITO or IZO or a reflective conductor such as Ag or Al.

The pixel electrodes 190 are physically and electrically connected to the drain electrodes 175 through the contact holes 185 such that the pixel electrodes 190 receive the data voltages from the drain electrodes 175. When the pixel electrodes 190 are supplied with the data voltages, they generate electric fields in cooperation with a common electrode (not shown) disposed opposite the pixel electrodes 190 and supplied with a common voltage, which determine the orientations of liquid crystal molecules of a liquid crystal layer (not shown) disposed between the two electrodes or yield currents in a light emitting layer (not shown) to emit light.

The pixel electrodes 190 overlap the gate lines 121 and the data lines 171 to increase aperture ratio.

The contact assistants 81 and 82 are connected to the exposed end portions 129 of the gate lines 121 and the exposed end portions 179 of the data lines 171 through the contact holes 181 and 182, respectively. The contact assistants 81 and 82 protect the exposed portions 129 and 179 and complement the adhesiveness of the exposed portions 129 and 179 and external devices.

Turning now to FIGS. 3-12, a method of manufacturing the TFT array panel shown in FIGS. 1 and 2 according to an exemplary embodiment of the present invention will now be described in detail. In FIGS. 3-12, parts equivalent to those in FIGS. 1 and 2 are represented with like reference numerals and a description thereof is omitted to avoid duplication.

FIGS. 3, 5, 7, 9 and 11 are layout views of the TFT array panel shown in FIGS. 1 and 2 in intermediate steps of a manufacturing method thereof according to an exemplary embodiment of the present invention. FIG. 4 is a sectional view of the TFT array panel shown in FIG. 3 taken along line IV-IV'. FIG. 6 is a sectional view of the TFT array panel shown in FIG. 5 taken along line VI-VI'. FIG. 8 is a sectional view of the TFT array panel shown in FIG. 7 taken along line VIII-VIII'. FIG. 10 is a sectional view of the TFT array panel shown in FIG. 9 taken along line X-X', and FIG. 12 is a sectional view of the TFT array panel shown in FIG. 11 taken along line XII-XII'.

Figure 3:
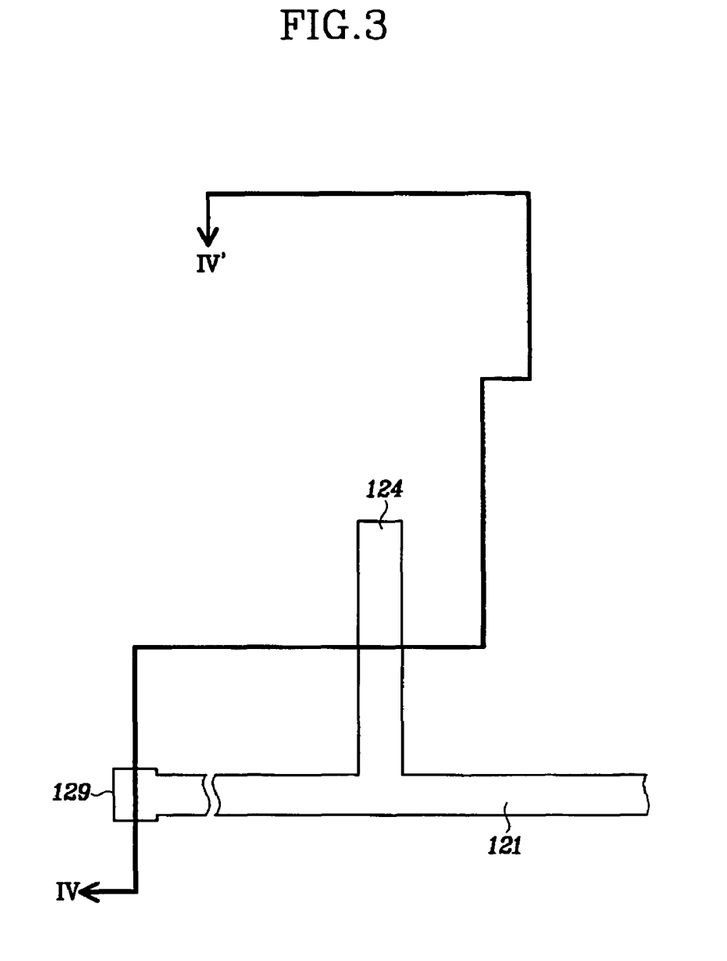
FIGS. 3, 5, 7, 9 and 11 are layout views of a TFT array panel shown in FIGS. 1 and 2 in intermediate steps of a manufacturing method thereof according to an embodiment of the present invention.
Figure 4:
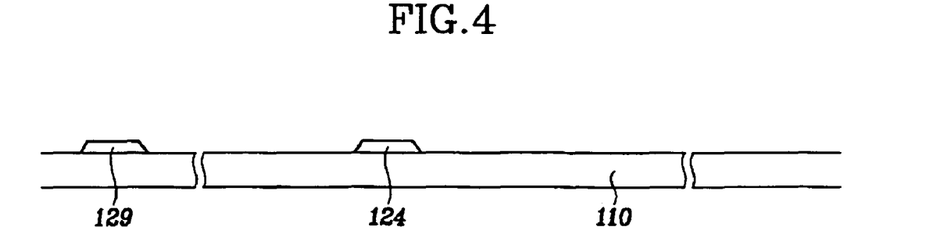
FIG. 4 is a sectional view of the TFT array panel shown in FIG. 3 taken along the line IV-IV'.

Referring to FIGS. 3 and 4, the gate line 121, including the gate electrode 124 and the end portion 129, is formed on the insulating substrate. The insulating substrate 110 may be made of transparent glass, silicone, or plastic.

Figure 5:
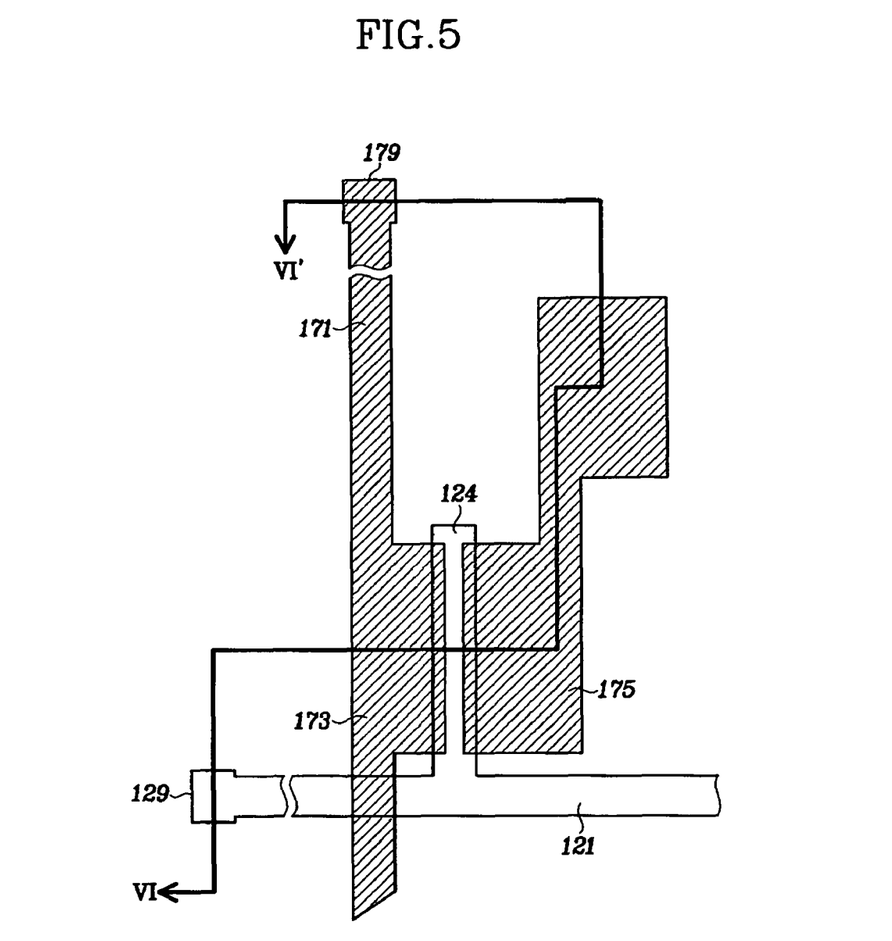
Figure 6:
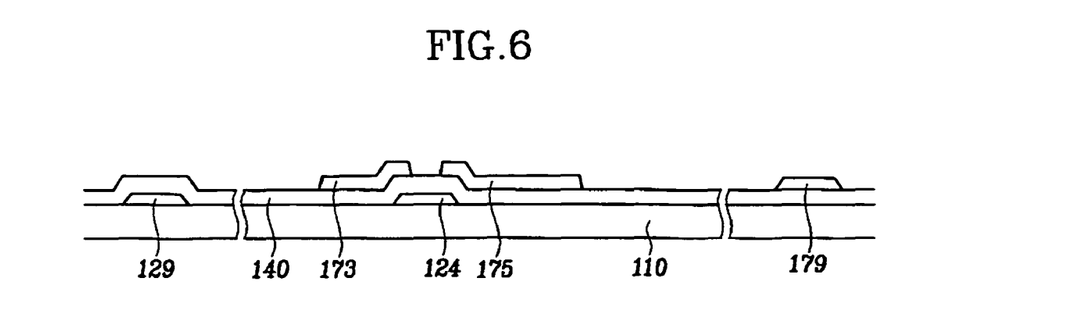
FIG. 6 is a sectional view of the TFT array panel shown in FIG. 5 taken along the line VI-VI'.

Referring to FIGS. 5 and 6, the gate insulating layer 140 is deposited on the substrate 110 by using, e.g., a chemical vapor deposition (CVD) method. The gate insulating layer 140 may have a thickness of about 500-3,000 Å. The gate insulating layer 140 may be dipped in octadecyl-trichlorosilane (OTS) and, thus, have a surface treated with the OTS. Thereafter, a conductive layer made of, for example, low resistivity metal such as Au is deposited by using, e.g., vacuum heat deposition, etc., on the gate insulating layer 140. The conductive layer is patterned by using, e.g., lithography and etching processes to form the data line 171 including the source electrode 173 and the end portion 179, and the drain electrode 175.

Figure 7:
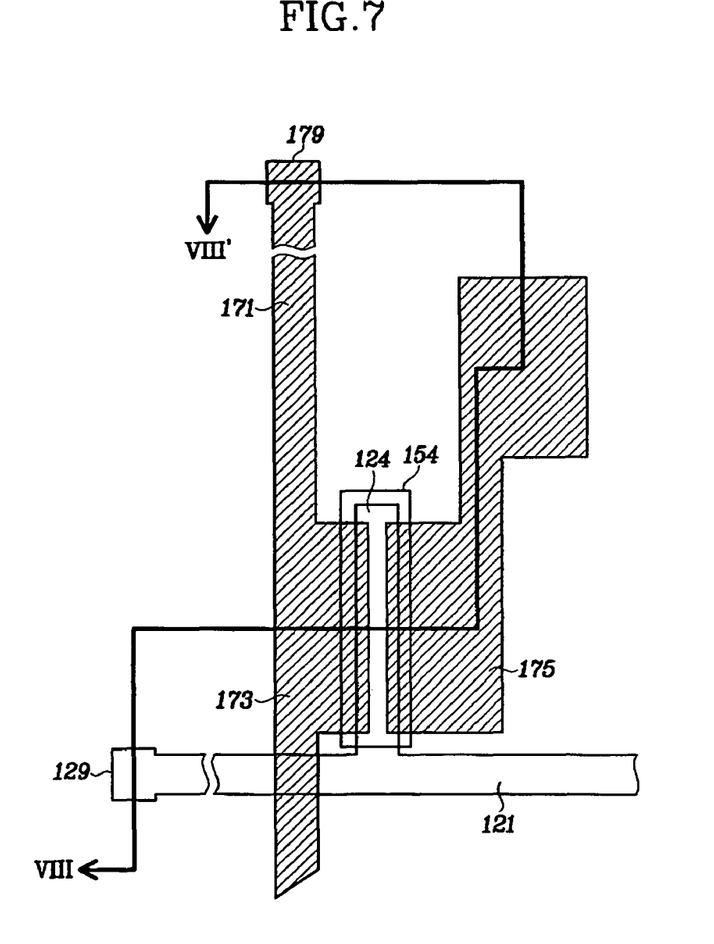
Figure 8:
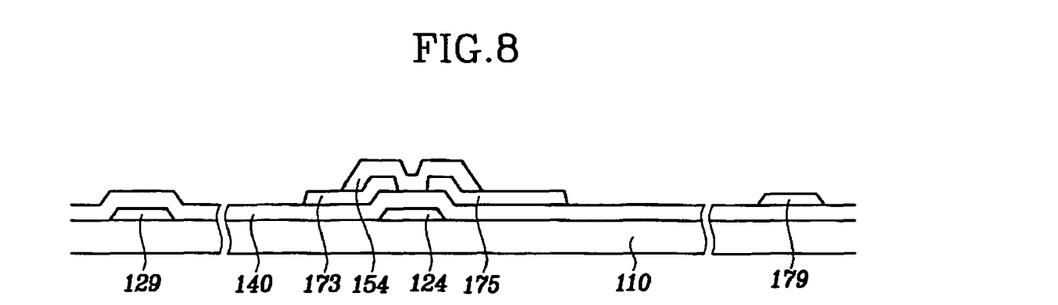
FIG. 8 is a sectional view of the TFT array panel shown in FIG. 7 taken along the line VIII-VIII'.

Referring to FIGS. 7 and 8, an organic semiconductor layer is deposited on the source electrode 173, drain electrode 175 and an exposed portion of the gate insulating layer 140 between the source and drain electrodes 173 and 175 by using, e.g., molecular beam deposition, vapor deposition, vacuum sublimation, CVD, PECVD, reactive deposition, sputtering, spin coating, etc., and patterned by using, for example, lithography and etching processes to form the organic semiconductor island 154.

Figure 9:
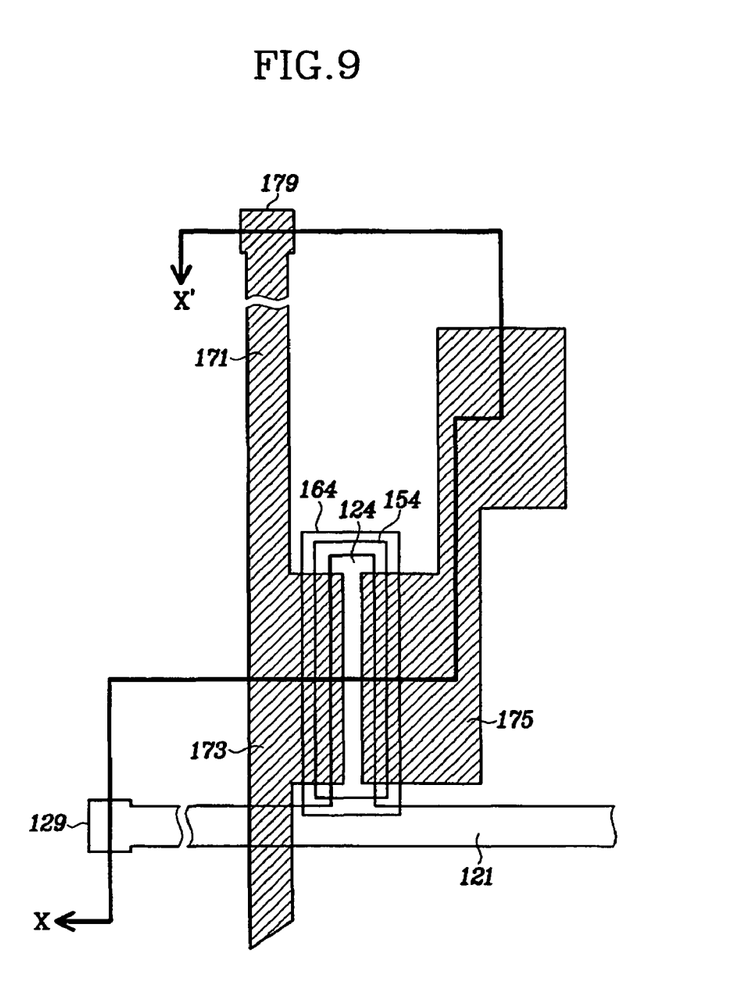
Figure 10:
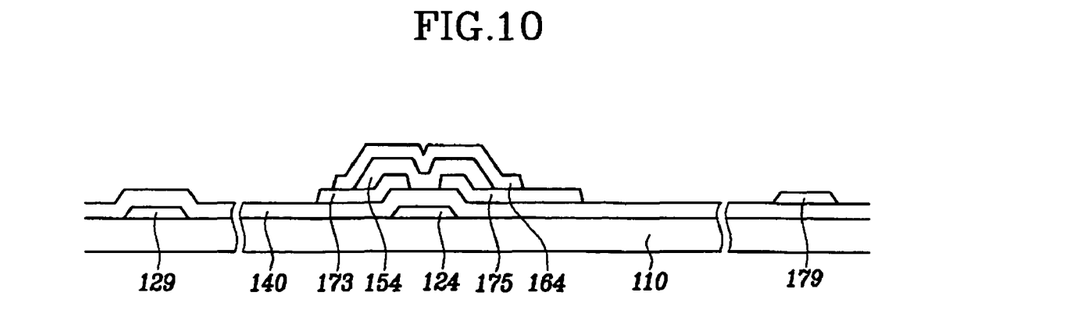
FIG. 10 is a sectional view of the TFT array panel shown in FIG. 9 taken along the line X-X'.

Referring to FIGS. 9 and 10, an insulating layer is dry deposited on the organic semiconductor island 154 at or below room temperature. The insulating layer may be made of a polyxylene polymer (commercially known as "parylene"). The low-temperature dry deposition of the insulating layer prevents the semiconductor island 154 from being damaged. The insulating layer is subjected to lithography and dry etch to form the protective member 164. The protective member 164 fully covers the organic semiconductor island 154.

Figure 11:
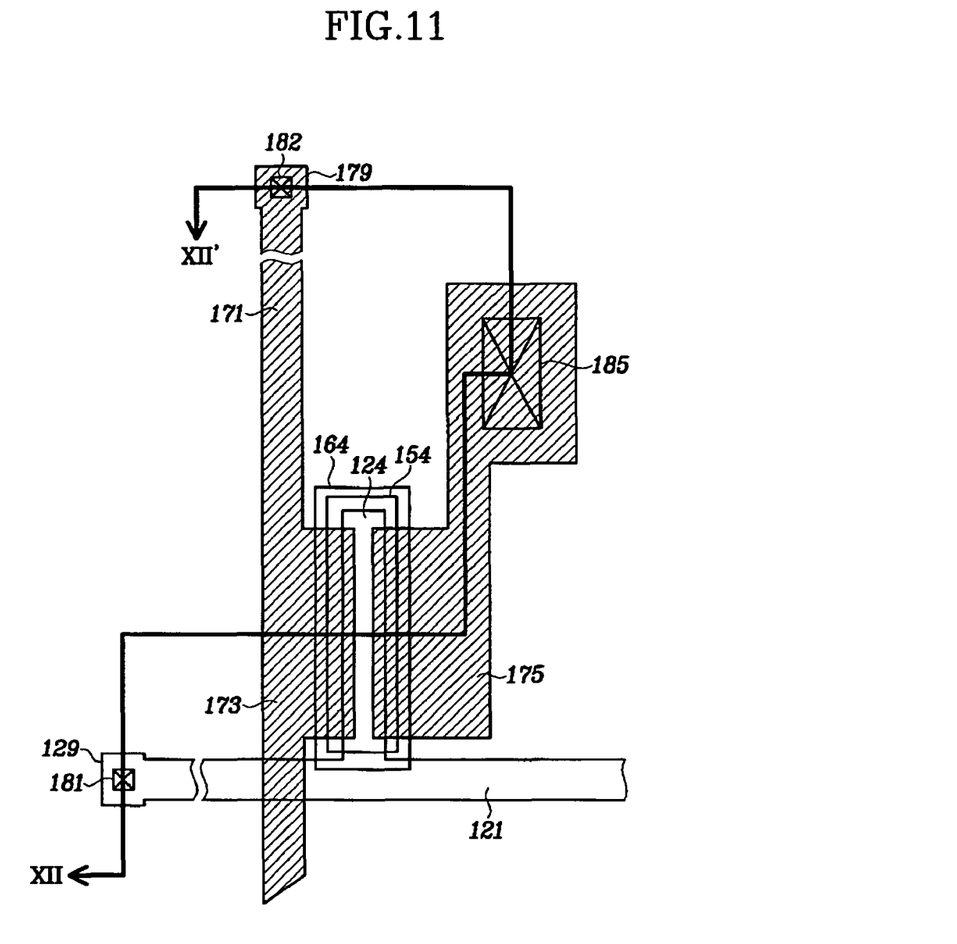
Figure 12:
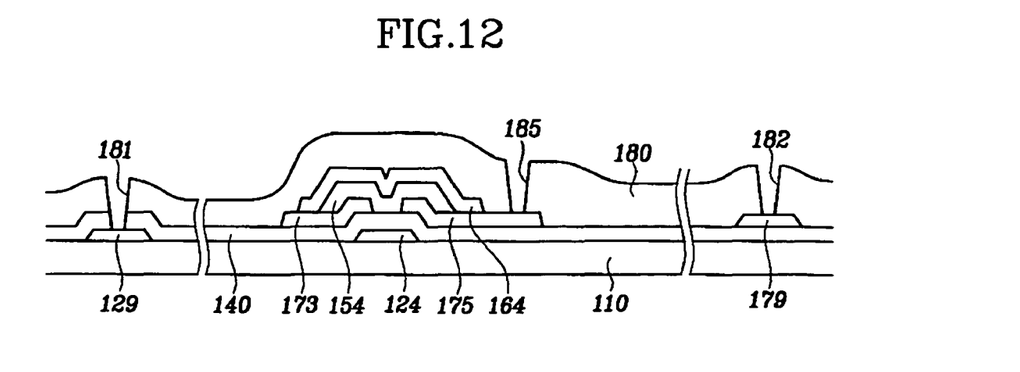
FIG. 12 is a sectional view of the TFT array panel shown in FIG. 11 taken along the line XII-XII'.

Referring to FIGS. 11 and 12, the passivation layer 180 is deposited and patterned along with the gate insulating layer 140 to form the contact holes 181, 182 and 185 exposing the end portions 129 and 179 of the gate line 121 and the data line 171 and a portion of the drain electrode 175, respectively. Since the organic semiconductor island 154 is fully covered by the protective member 164, the organic semiconductor island 154 is not affected by the formation of the passivation layer 180.

The pixel electrode 190 and the contact assistants 81 and 82 are formed on the passivation layer 180 as shown in FIGS. 1 and 2. The organic semiconductor island 154 is not affected by the formation of the pixel electrode 190 and the contact assistants 81 and 82 since the organic semiconductor island 154 is not exposed.

Since the organic semiconductor island 154 is fully covered by the protective member 164, thereby preventing damage to the organic semiconductor island 154, the reliability of the organic TFTs is increased and the manufacturing process is simplified.

The present invention may be employed to any display devices including LCD and OLED.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of manufacturing a thin film transistor array panel, the method comprising:
   forming a gate line on a substrate;
   forming a gate insulating layer on the gate line;
   forming a data line and a drain electrode on the gate insulating layer;
   forming an organic semiconductor layer on the data line, the drain electrode, and an exposed portion of the gate insulating layer between the data line and the drain electrode;
   forming a protective member fully covering the organic semiconductor layer;
   forming a passivation layer on the protective member, the data line, and the drain electrode;

forming a contact hole in the passivation layer to expose a portion of the drain electrode; and forming a pixel electrode on the passivation layer, the pixel electrode being connected to the drain electrode through the contact hole, wherein the forming the protective member comprises:

depositing an insulating layer at a temperature equal to or lower than a room temperature; and patterning the insulating layer in a dry manner to form the protective member.

2. The method of claim 1, wherein the protective member comprises polyxylene polymer.

3. The method of claim 1, wherein the organic semiconductor layer comprises at least one selected from the group consisting of:

tetracene, pentacene, and derivatives thereof with substituent;

oligothiophene including four to eight thiophenes connected at the positions 2, 5 of thiophene rings;

perylenetetracarboxylic dianhydride (PTCDA), naphthalenetetracarboxylic dianhydride (NTCDA), and imide derivatives thereof;

metallized phthalocyanine and halogenated derivatives thereof;

co-oligomer and co-polymer of thienylene and vinylene;

regioregular polythiophene;

perylene, coroene, and derivatives thereof with substituent; and aromatic and heteroaromatic ring of the above-described materials with at least one hydrocarbon chain having one to thirty carbon atoms.

4. The method of claim 1, wherein the gate insulating layer comprises at least one selected from the group consisting of silicon dioxide, silicon nitride, maleimide-styrene, polyvinylphenol (PVP), and modified cyanoethylpullulan (m-CEP).

5. The method of claim 4, wherein the gate insulating layer has a surface treated with octadecyl-trichloro-silane.

* * * * *